United States Patent
Wang et al.

(10) Patent No.: US 7,222,277 B2
(45) Date of Patent: May 22, 2007

(54) TEST OUTPUT COMPACTION USING RESPONSE SHAPER

(75) Inventors: Seongmoon Wang, Plainsboro, NJ (US); Srimat T. Chakradhar, Manalapan, NJ (US); Chia-Tso Chao, Goleta, CA (US)

(73) Assignee: NEC Laboratories America, Inc., Princeton, NJ (US)

( * ) Notice: Subject to any disclaimer, the term of this patent is extended or adjusted under 35 U.S.C. 154(b) by 286 days.

(21) Appl. No.: 10/985,599

(22) Filed: Nov. 10, 2004

(65) Prior Publication Data

US 2006/0101316 A1    May 11, 2006

(51) Int. Cl.
*G01R 31/28* (2006.01)

(52) U.S. Cl. .................................................. 714/726

(58) Field of Classification Search .............. 714/726, 714/727, 729, 732, 733, 738
See application file for complete search history.

(56) References Cited

U.S. PATENT DOCUMENTS 6,557,129 B1 * 4/2003 Rajski et al. ............... 714/729
2005/0278593 A1 * 12/2005 Muradali et al. ........... 714/724

* cited by examiner

*Primary Examiner*—James C Kerveros

(57) ABSTRACT

A test output compaction architecture and method that takes advantage of a response shaper in order to minimize masking of faults during compaction. A response shaper is inserted between a plurality of scan chains and an output compactor. The response shaper receives output responses from scan chains and reshapes the output responses in a manner that minimizes masking of faults by the output compactor.

16 Claims, 10 Drawing Sheets

(A)

(B)

(A)

(B)

TEST OUTPUT COMPACTION USING RESPONSE SHAPER

BACKGROUND OF THE INVENTION

The present invention is related to testing of logic circuit designs and, in particular, to compaction of test response data.

Testing of complicated digital logic circuits requires the analysis of a large amount of test response data. A variety of output compaction techniques have been devised for reducing the size of test response data stored in test memory. Most output compaction techniques use combinational circuits, predominantly built of exclusive-OR (XOR) networks, to reduce the number of scan channels that will be observed by automatic test equipment (ATE) during test applications. Unfortunately, such XOR-based output compactors disadvantageously can have decreased fault coverage caused by the masking of errors during a shift cycle. If there are an even number of scan flip-flops that drive the same XOR tree and are scanned out at the same shift cycle, then the errors are masked out and cannot be observed by the ATE. Likewise, a circuit under test (CUT) may produce unknown values during a simulation step that is required to compute output responses of the CUT to the applied stimuli. If an error is captured in a scan flip-flop that is scanned out at the same shift cycle as another scan flip-flop whose value is unknown and the two scan flip-flops drive the same XOR network, then the error again cannot be observed. A variety of sophisticated output compactors, implemented with complex arrays of XOR gates, have been devised to avoid error masking issues. See, e.g., S. Mitra and K. S. Kim, "X-Compact: An Efficient Response Compaction Technique for Test Cost Reduction," IEEE International Test Conference Proceedings, pp. 311-20 (October 2002); J. Rajski, K. Tyszer, C. Wang, S. M. Reddy, "Convolutional Compaction of Test Responses," IEEE International Test Conference Proceedings, pp. 745-54 (September/October 2003); C. Wang, S. M. Reddy, I. Pomeranz, J. Rajski, J. Tyszer, "On Compacting Test Response Data Containing Unknown Values," IEEE International Conference on Computer Aided Design, pp. 855-62 (November 2003). See FIG. 1A. Unfortunately, even such sophisticated output compactors, which use more XOR gates than a simple XOR tree, cannot avoid masking an even number of errors greater than two in a single shift cycle.

Synopsys's XDBIST has an output compactor that avoids the masking of errors by using a multiplexer instead of an XOR network to select scan chains that scan out errors. See P. Wohl, J. A. Waicukauski, S. Patel, "Scalable Selector Architecture for X-Tolerant Deterministic BIST," IEEE 41$^{st}$ Design Automation Conference, pp. 934-939 (June 2004). See FIG. 1B. Although it can handle unknown values better than prior art XOR network-based output compactors, XBDIST's output compactor can only achieve a limited compression ratio and also requires additional test data to control the multiplexer and a special dedicated automatic test pattern generator (ATPG) that is compatible with the output compactor.

Accordingly, there is a need for improved test response compaction which can minimize issues such as the masking of faults.

SUMMARY OF INVENTION

A logic testing architecture and a method of output compaction is herein disclosed which advantageously minimizes the masking of faults. In accordance with an embodiment of the invention, a response shaper is inserted between a plurality of scan chains and an output compactor. The output compactor advantageously can utilize conventional compaction techniques, such as those based on XOR networks that allow masking of faults in certain situations. The response shaper receives output responses from the scan chains and reshapes the output responses in a manner that minimizes such masking of faults by the output compactor. For example, in one embodiment, the response shaper uses delay circuits to selectively delay an output response from one of the scan chains. In another embodiment, the response shaper can use an advancing circuit to selectively advance an output response from one of the scan chains. Such circuits can be controlled by signals from a decoder in the response shaper, the signals computed beforehand through fault simulation. By selectively advancing or delaying an output response from one of the scan chains by one or more scan shift cycles, the response shaper can thereby minimize the masking of errors caused by situations such as unknown values or even numbers of errors. The response shaper can be configured to reshape output responses from all of the scan chains or, if there are a large number of scan chains, can reshape responses from only selected scan chains so as to reduce hardware overhead.

The present invention advantageously can be utilized with simplistic compaction structures such as XOR trees. The present invention also does not require specialized test patterns or test pattern generation tools. These and other advantages of the invention will be apparent to those of ordinary skill in the art by reference to the following detailed description and the accompanying drawings.

DETAILED DESCRIPTION

Figure 1:
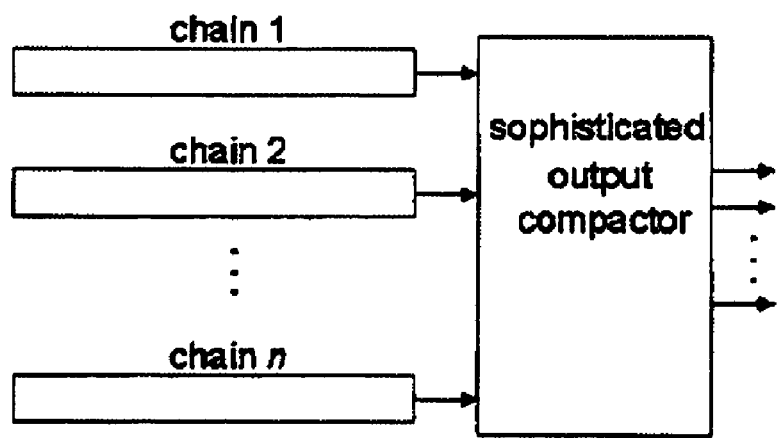
FIGS. 1A and 1B are abstract block diagrams of two prior art output compactor designs.
Figure 1:
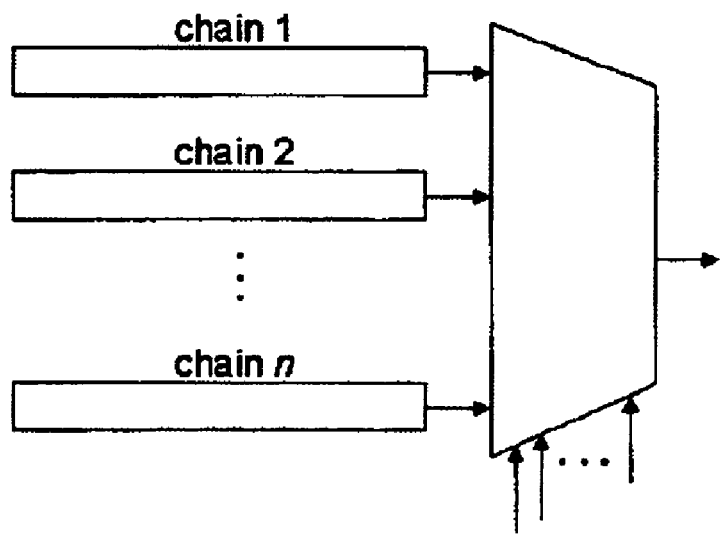
Figure 2:
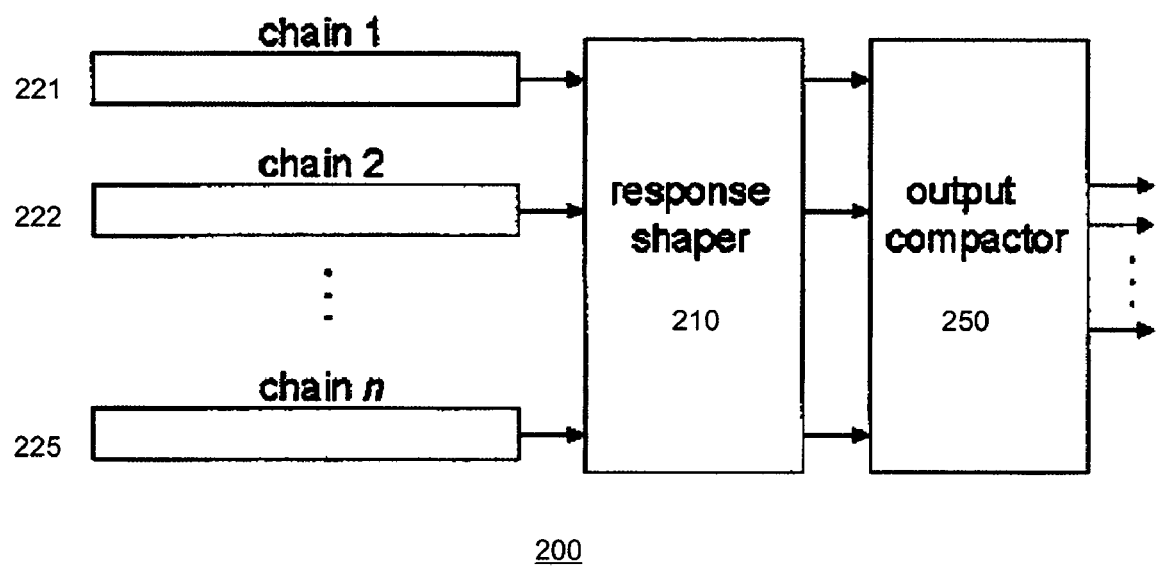
FIG. 2 is a block diagram of an output compactor architecture, in accordance with an embodiment of the invention.

FIG. 2 is a block diagram illustrating an embodiment of the present invention. The output compaction architecture 200 comprises a response shaper 210 which is inserted between the outputs of the scan chains 221, 222, . . . , 225 and the inputs of the output compactor 250. The output compactor 250 advantageously need not be a sophisticated array of exclusive-OR (XOR) gates. In fact, the output compactor 250 can be implemented by any XOR network-based compactor and even the most primitive XOR tree. It is accepted that the output compactor 250 will allow some masking of faults to occur during compaction. The response shaper 210, the operation and design of which is further described in detail herein, serves to "reshape" responses from the scan chains 221, 222, . . . , 225 in a manner that preferably minimizes the masking of faults by the output compactor 250.

Figure 3:
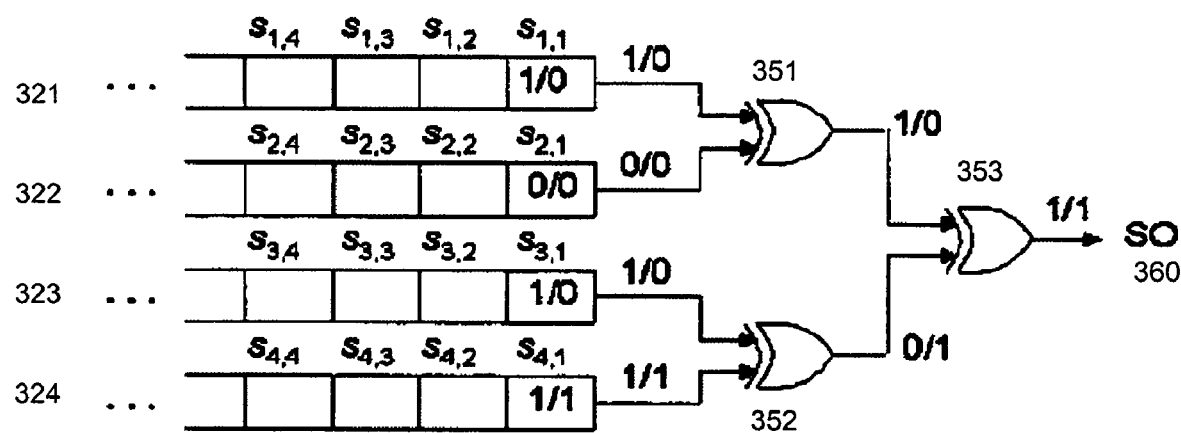
FIG. 3 through 5 illustrate the reshaping of test response data before compaction.
Figure 4:
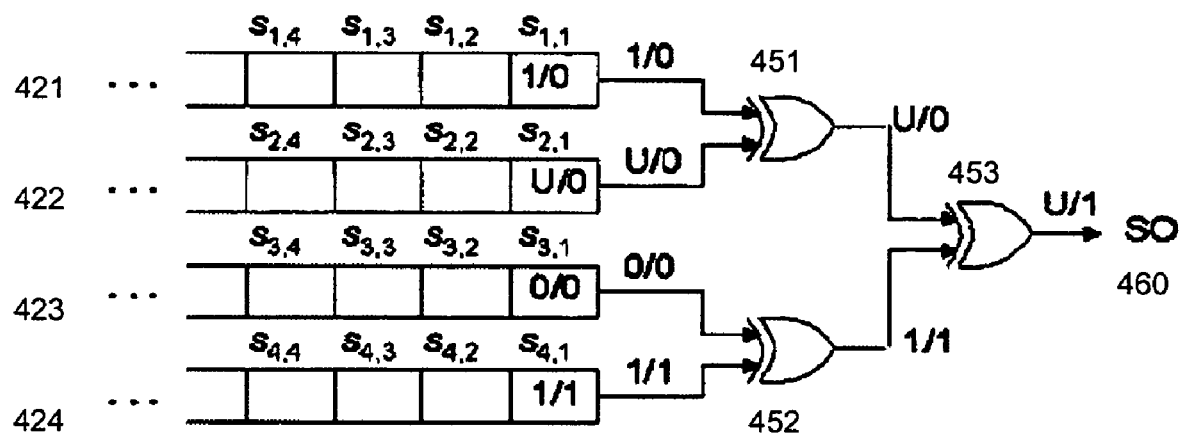
Figure 5:
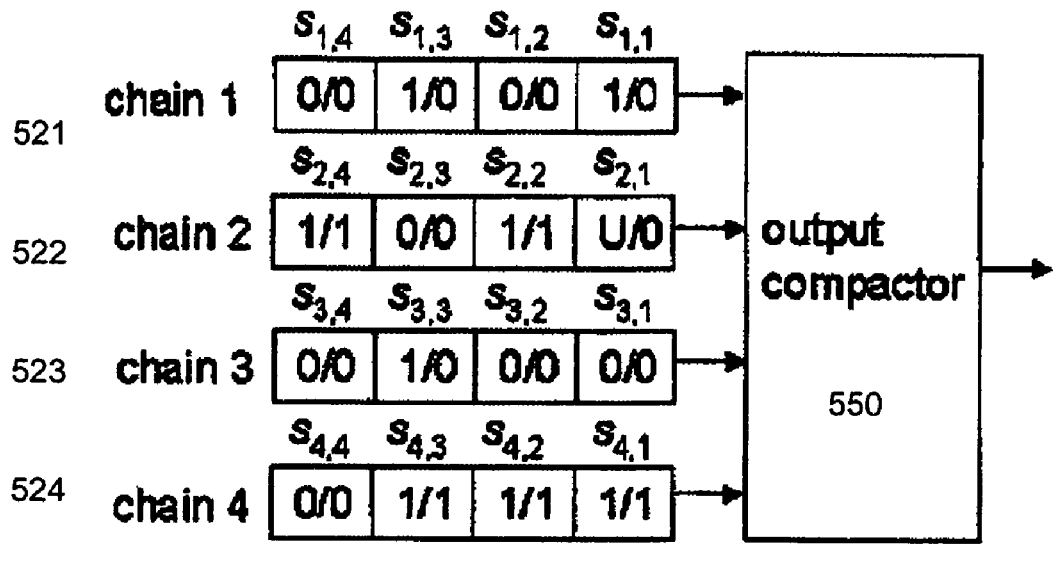
Figure 5:
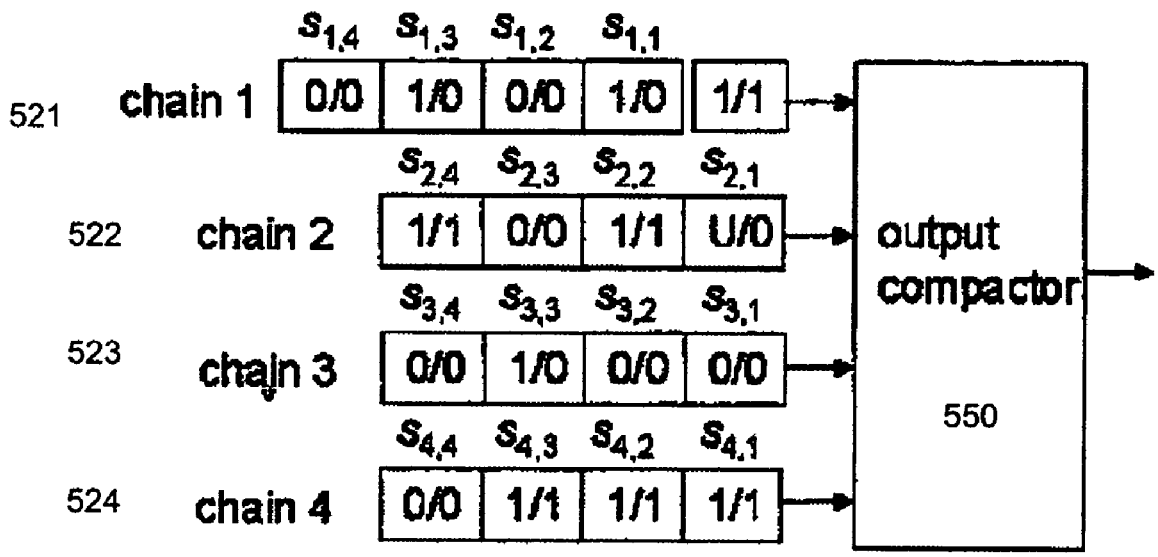

FIG. 3 through 5 illustrate the principles behind the reshaping of the scan chain responses. FIG. 3 depicts a simple 4-to-1 output compactor implemented with XOR gates 351, 352, 353 that can be used to observe four internal scan chains 321, 322, 323, and 324 with one external scan chain output (SO) 360. Assume that the four scan flip-flops (depicted as rectangles) $s_{1,1}$, $s_{2,1}$, $s_{3,1}$, and $s_{4,1}$ in the scan chains currently hold the responses of the circuit to the previous test pattern. With reference to FIG. 3 through 5, the notation g/f, where g=f=0 or 1, inside each of the scan flip-flops denotes the good circuit and faulty circuit responses that are captured into the flip-flop. When the good circuit value of a flip-flop is opposite to its faulty circuit value, i.e., 1/0 or 0/1, then the flip-flop is said to capture an error. FIG. 3 shows that flip-flops $s_{1,1}$ and $s_{3,1}$, whose values are scanned out at the same cycles, have captured errors. Values that are scanned out of each internal scan chain output will propagate through the output compactor network to the external scan chain output 360 which in turn is observed by automatic test equipment (ATE). Even though there are multiple scan flip-flops that captured errors, the good circuit value at the external scan chain output is equivalent to its faulty circuit value. The errors that are propagated to the two inputs of the second stage XOR gate 353 are "masked." Therefore, the defect that caused errors at $s_{1,1}$ and $s_{3,1}$ cannot be observed by the ATE because the two errors cancel each other out when they pass through the XOR network.

FIG. 4 shows another case where the error values are masked. Again, a simple 4-to-1 output compactor is depicted with XOR gates 451, 452, 453 that can be used to observe four internal scan chains 421, 422, 423, and 424 with one external scan chain output 460. If an error is scanned out with an unknown value at the same cycle, the error is masked and cannot be observed by the ATE. In FIG. 4, the symbol "U" denotes an unknown value, i.e., a value that can be either 0 or 1. Among the four flip-flops that are scanned out at the current shift cycle, only $s_{1,1}$ has an error value. However, since the good circuit value at $s_{2,1}$ is unknown, the error value at $s_{1,1}$ cannot be observed. Unknown values can occur for several reasons: for example, the circuit can have flip-flops that are not scanned, the circuit can contain bus drivers whose control signals are not fully decoded, etc. Normally, good circuit responses of a circuit are computed by conducting logic simulation for the circuit. Limitations in simulation accuracy can also cause unknown values.

FIG. 5 illustrates how reshaping responses helps the simple output compactor depicted in FIGS. 3 and 4 detect defects. Assume that scan chains 521, 522, 523, 524 of a circuit capture responses as shown in FIG. 5A. FIG. 5A shows that flip-flops $s_{1,1}$, $s_{1,3}$, and $s_{3,3}$ hold errors. If the simple output compactor depicted in FIGS. 3 and 4 is used to compress output responses, then all errors are masked and no defect can be observed at the output of the output compactor. The error in $s_{1,1}$ is scanned out with the unknown value in $s_{2,1}$ and the two errors in $s_{1,3}$ and $s_{3,3}$ are scanned at the same shift cycles. Assume that a flip-flop, which is initialized to 1/1 before the scan shift operation starts, is inserted between $s_{1,1}$ and the corresponding input to the compactor to delay the first scan chain 521 by one clock cycle, as depicted in FIG. 5B. That is, responses captured in the scan chain 521 are "reshaped" by the inserted flip-flop. In FIG. 5B, no error value is scanned out with another error or unknown value at any shift cycle and all errors can be observed at the output of the compactor. The simple shape compactor can thereby detect defects when even number errors are scanned out and/or errors are scanned out along with unknown values at the same shift cycle.

Figure 6:
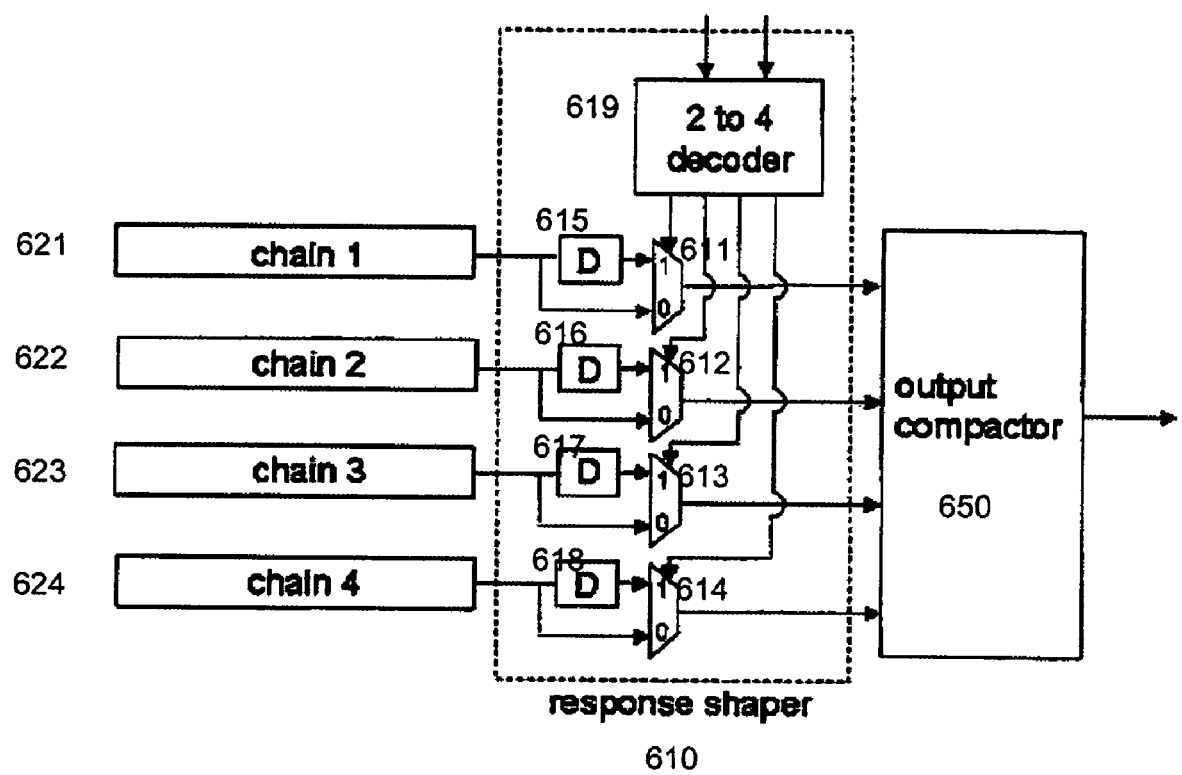
FIG. 6 is a block diagram showing an illustrative response shaper design that serves to selectively delay one of the scan chains before compaction.

FIG. 6 shows an implementation of a response shaper 610 for a circuit with four scan chains 621, 622, 623, 624. In accordance with an embodiment of the invention, the response shaper 610 is comprised of delay elements 615, 616, 617, 618, multiplexers 611, 612, 613, 614, and a 2-to-4 decoder 619. Each delay element and multiplexer is inserted between each scan chain output and the corresponding input of the output compactor 650. The 2-to-4 decoder 619 generates signals that select a scan chain output that will be delayed. For example, if the input of the decoder is set to i, where i=1, 2, 3, or 4, then responses that are scanned out of chain i are delayed before they are input to the compactor and responses from the other scan chains are input to the compactor without any delay. It should be noted that delay elements that can delay the selected scan chain by more than one cycle can be readily used, in the situation where it is anticipated that no error can be observed at the output of the compactor 650 by delaying only one shift cycle (for example, where an error appears with an unknown value and another unknown value appears at the next cycle).

Figure 7:
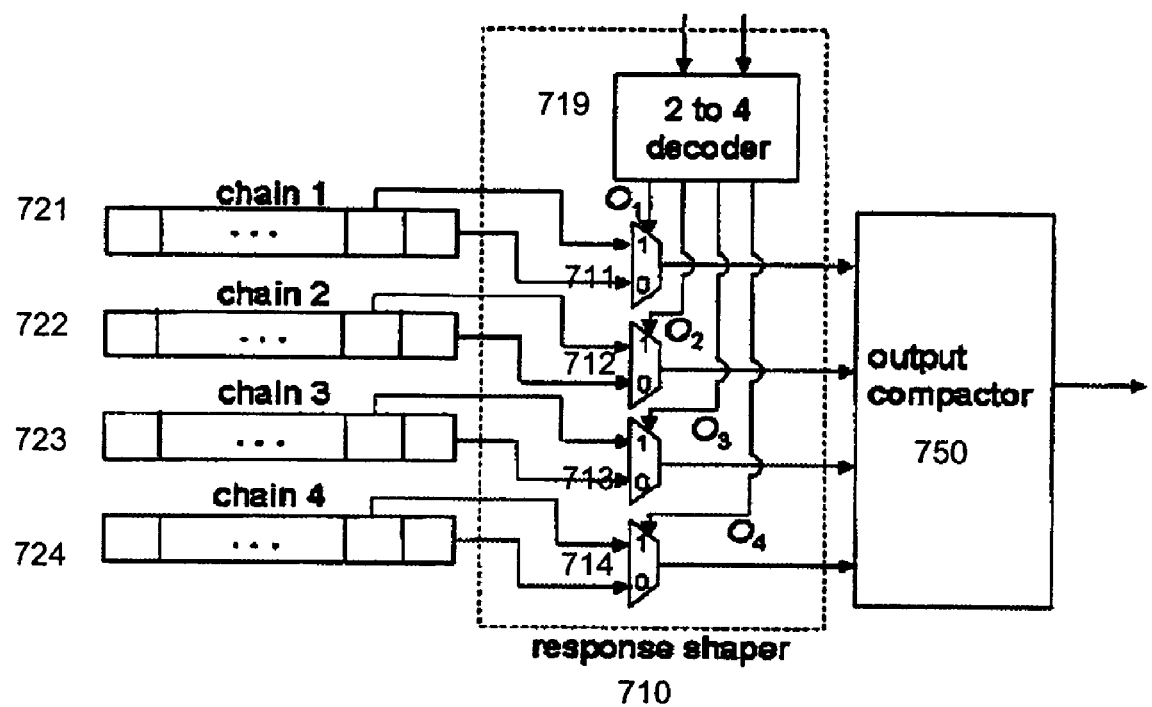
FIG. 7 is a block diagram showing an illustrative response shaper design that serves to selectively advance one of the scan chains before compaction.

FIG. 7 depicts an alternative embodiment which does not utilize delay elements to reshape responses of selected scan chains. The function of this response shaper 710 is similar to that of the response shaper illustrated in FIG. 6. Again, the response shaper 710 is inserted between four scan chains 721, 722, 723, 724 and the output compactor 750. However, unlike the response shaper shown in FIG. 6 which delays responses of the selected scan chain, responses of the selected scan chain in FIG. 7 will be input to the compactor earlier than the other scan chains, for example by one cycle. The response shaper 710 comprises a 2-to-4 decoder 719 that generates signals to four multiplexers 711, 712, 713, 714 which can selectively advance responses from one of the scan chains 721, 722, 723, 724. Since delay elements are not used, this approach can reduce hardware overhead to implement the response shaper.

Figure 8:
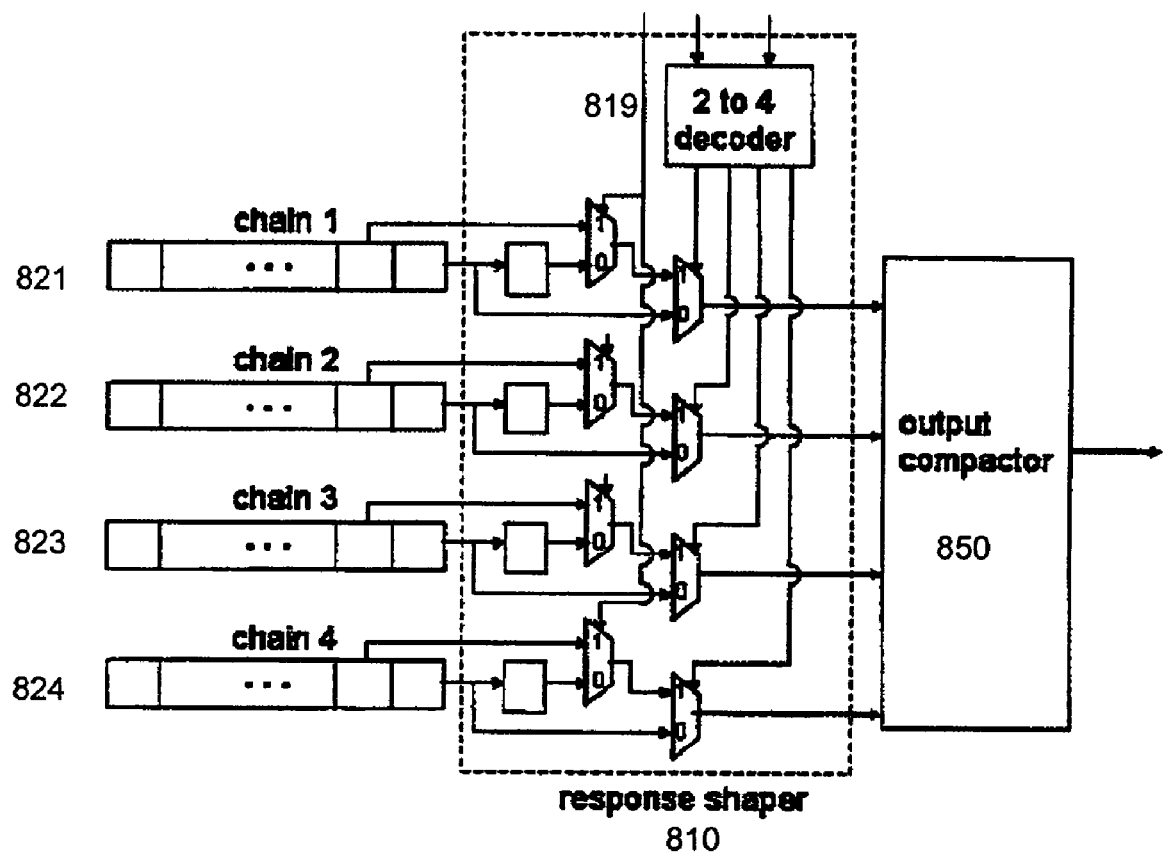
FIG. 8 is a block diagram showing an illustrative response shaper design that serves to either selectively advance or delay one of the scan chains before compaction.

FIG. 8 shows an example of how the two different schemes can also be combined together to both delay and advance responses of selected scan chains. An extra multiplexer is provided with each element of the response shaper 810 that is inserted between each scan chain output and each corresponding input of the output compactor 850. The extra multiplexer is responsive to a control signal that can select whether to delay or advance a scan chain in a shift cycle while the decoder 819 is still used to identify which of the scan chains 821, 822, 823, 824 will be delayed or advanced.

Figure 9:
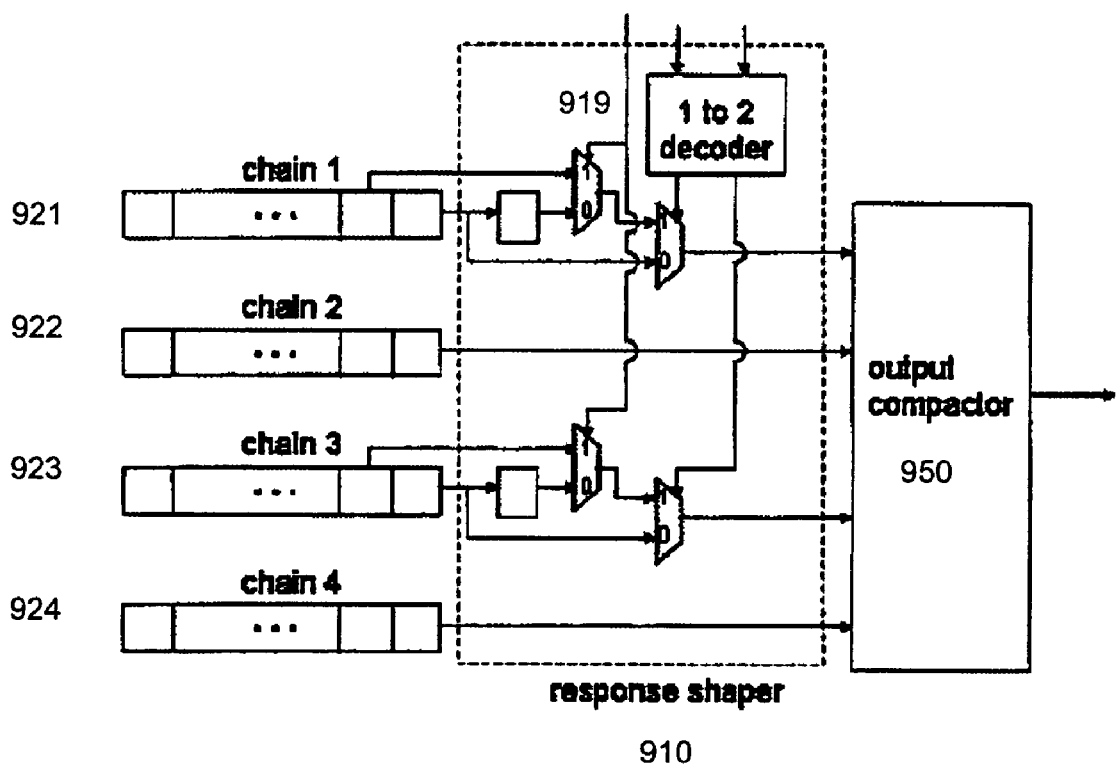
FIG. 9 is a block diagram showing an illustrative response shaper design that is inserted only for some of the scan chains.

If the circuit into which the response shaper is inserted has a large number of scan chains, then the hardware overhead of the above embodiments can be reduced by selectively inserting the response shaper elements into the output compaction scheme, as illustrated by FIG. 9. In FIG. 9, the delay elements and multiplexers from the above-described response shaper embodiment are only inserted for selected scan chains to reduce hardware overhead. Although the circuit has four scan chains 921, 922, 923, 924, the response shaper 910 only inserts delay elements and multiplexers for two scan chains 921, 923, as depicted in FIG. 9.

Figure 10:
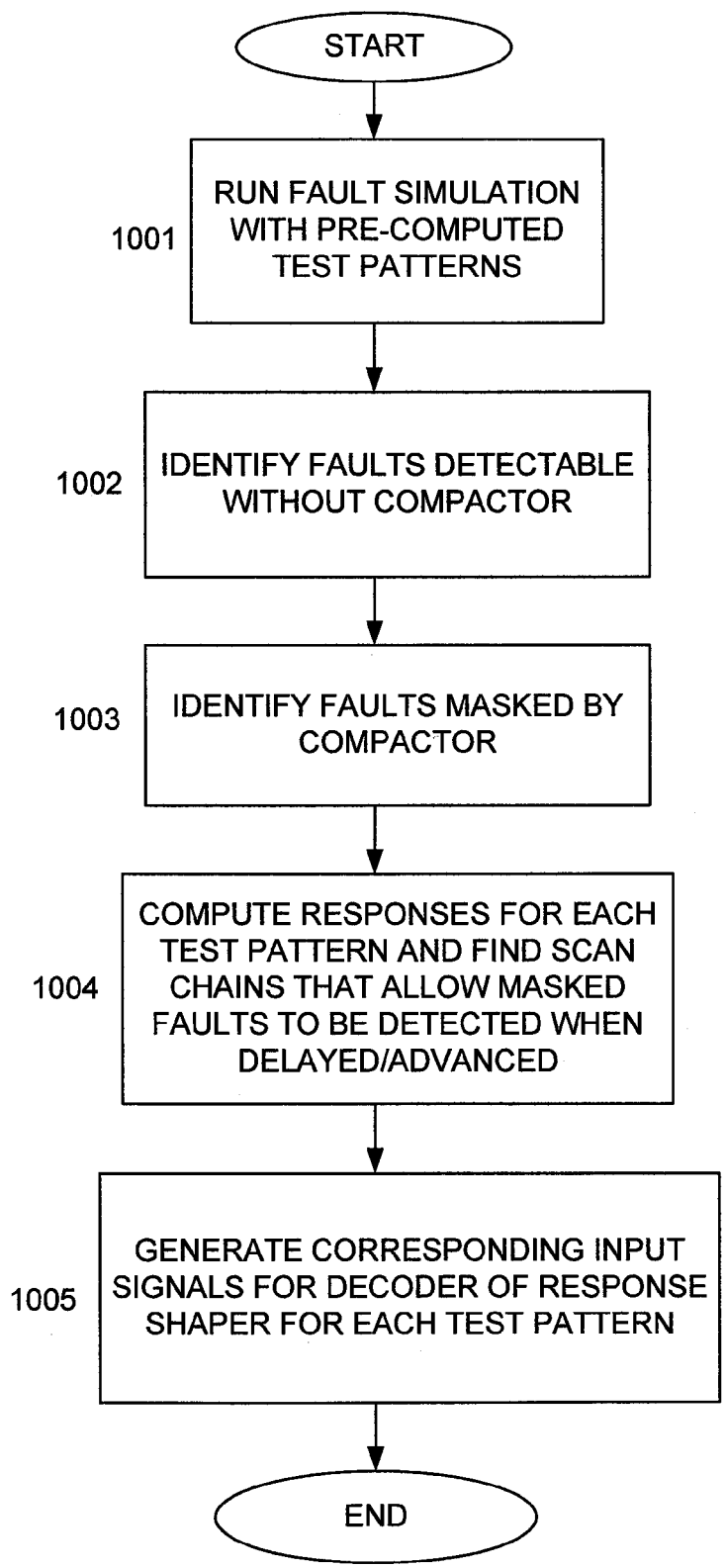
FIG. 10 is a flowchart of processing performed in computing control signals for a response shaper.

FIG. 10 is a flowchart of processing performed to generate the control signals for the above-described response shaper, in accordance with an illustrative embodiment of the invention. At step 1001, a fault simulation is run with the pre-computed test patterns from a first test pattern $p_1$ to a last test pattern $p_n$, where n is the number of pre-computed test patterns. At step 1002, an identification is made of faults $F_i$ newly detected by each test pattern $p_i$, where i=1, 2, . . . n. This is conducted under the assumption that all scan chains are directly observed without an output compactor. At step 1003, the masked faults for each test pattern are identified, namely those faults which can be observed without the use of an output compactor but cannot be observed if the scan chains are observed via the output compactor. These masked faults are placed into a masked fault list $F_{mask}$.

At step 1004, responses are computed to each test pattern. From the last test pattern $p_n$ toward the first test pattern $p_1$, responses are computed to each test pattern, $r_i$, where i=1, 2, . . . n, and the values captured in each scan flip-flop. If there is any fault in $F_i$ that is masked when the scan chains are observed via the output compactor, then search is conducted for a scan chain that allows all faults to be detected when it is delayed (or advanced depending on the embodiment discussed above). If there is more than one such scan chain, then a decision can be made to select the scan chain that can detect the most faults in the masked fault list $F_{mask}$. As a fault is determined to be detectable by a reshaped scan chain, the fault is dropped from the fault list: an identification is made of all faults from the entire fault list that are detected when the selected scan chain is delayed (or advanced) and the detected faults are removed from fault list $F_i$ for every test pattern $p_i$, where i=1, 2, . . . n, and also from the masked fault list $F_{mask}$.

At step 1005, the input signals for the decoder of the response shaper are generated for each test pattern using the information obtained in step 1004.

In the foregoing, if it is assumed that the response shaper will delay and/or advance only a single scan chain for entire shift cycles to scan out a response completely, then there is a need for only one set of decoder control signals for each test pattern. This advantageously minimizes the test data volume that is to be stored to control the response shaper. If, however, there are test patterns having detected faults that cannot be detected by delaying or advancing any scan chain, then it should be noted that it is possible to switch scan chains that are reshaped in the middle of scan shift operation for the response. Thus, multiple sets of control signals would be generated for those test patterns. Although this may increase test data volume, it could advantageously achieve the same fault coverage that can be achieved when scan chains are directly observed without the use of any output compactor—even in the presence of a large number of unknown values.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow and their structural and functional equivalents. As but one of many variations, it should be understood that the response shaper described herein can be utilized with a wide variety of output compaction schemes.

What is claimed is:

1. A logic testing architecture comprising:
    a plurality of scan chains;
    an output compactor; and
    a response shaper coupled to the output compactor and at least one of the scan chains and which reshapes output responses from the at least one of the scan chains and passes the reshaped output responses to the output compactor to minimize masking of faults by the output compactor.

2. The logic testing architecture of claim 1 wherein the response shaper comprises at least one delay circuit which selectively delays an output response from one of the scan chains.

3. The logic testing architecture of claim 1 wherein the response shaper comprises at least one advancing circuit which selectively advances an output response from one of the scan chains.

4. The logic testing architecture of claim 1 wherein the response shaper is coupled to all or some of the plurality of scan chains and can selectively reshape output responses from any of the plurality of scan chains.

5. The logic testing architecture of claim 1 wherein the output compactor comprises an XOR network.

6. A logic testing architecture comprising:
    a plurality of scan chains;
    an output compactor; and
    a response shaper further comprising a decoder which provides signals to a delay circuit, the delay circuit coupled to the output compactor and to one of the plurality of scan chains and which, responsive to the signal from the decoder, selectively delays an output response from the one of the plurality of scan chains to minimize masking of faults by the output compactor.

7. The logic testing architecture of claim 6 wherein the decoder uses signals computed through fault simulation to select one of the plurality of scan chains to be delayed.

8. The logic testing architecture of claim 6 wherein the response shaper further comprises an advancing circuit, the advancing circuit also coupled to the output compactor and to the one of the plurality of scan chains and which, responsive to the signal from the decoder, selectively advances the output response from the one of the plurality of scan chains.

9. The logic testing architecture of claim 6 wherein the output compactor comprises an XOR network.

10. A logic testing architecture comprising:
    a plurality of scan chains;
    an output compactor; and
    a response shaper further comprising a decoder which provides signals to an advancing circuit, the advancing circuit coupled to the output compactor and to one of the plurality of scan chains and which, responsive to the signal from the decoder, selectively advances an output response from the one of the plurality of scan chains to minimize masking of faults by the output compactor.

11. The logic testing architecture of claim 10 wherein the decoder uses signals computed through fault simulation to select one of the plurality of scan chains to be advanced.

12. The logic testing architecture of claim 10 wherein the output compactor comprises an XOR network.

13. A method of test output compaction comprising the steps of:
    receiving a plurality of test responses from a plurality of scan chains;

reshaping the test responses to minimize masking of faults by an output compactor; and passing the reshaped responses to the output compactor for output compaction.

14. The method of claim 13 wherein the step of reshaping the test responses further comprises the step of delaying a test response from one of the plurality of scan chains.

15. The method of claim 13 wherein the step of reshaping the test responses further comprises the step of advancing a test response from one of the plurality of scan chains.

16. The method of claim 13 wherein the output compactor uses an XOR network to perform compaction.

* * * * *